(12) United States Patent
Peng et al.

(10) Patent No.: US 10,985,045 B2
(45) Date of Patent: Apr. 20, 2021

(54) ELECTROSTATIC CHUCK MECHANISM AND SEMICONDUCTOR PROCESSING DEVICE HAVING THE SAME

(71) Applicant: BEIJING NAURA MICROELECTRONICS EQUIPMENT CO., LTD, Beijing (CN)

(72) Inventors: Yulin Peng, Beijing (CN); Haiying Liu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 359 days.

(21) Appl. No.: 16/008,803

(22) Filed: Jun. 14, 2018

(65) Prior Publication Data

US 2018/0294177 A1 Oct. 11, 2018

Related U.S. Application Data

(63) Continuation of application No. PCT/CN2016/109237, filed on Dec. 9, 2016.

(30) Foreign Application Priority Data

Dec. 17, 2015 (CN) .......................... 201510954383.0

(51) Int. Cl.
*H01L 21/683* (2006.01)
*H01L 21/67* (2006.01)
(Continued)

(52) U.S. Cl.
CPC .......... *H01L 21/6833* (2013.01); *H01J 37/32* (2013.01); *H01L 21/4871* (2013.01);
(Continued)

(58) Field of Classification Search
CPC ... H01L 21/6833; H01L 21/4871; H01J 37/32
(Continued)

(56) References Cited

U.S. PATENT DOCUMENTS

2004/0261946 A1* 12/2004 Endoh ............... H01J 37/32082
156/345.15
2010/0103584 A1 4/2010 Nam

FOREIGN PATENT DOCUMENTS

| CN | 101465313 A | 6/2009 |
|----|----|----|
| CN | 101488468 A | 7/2009 |

(Continued)

OTHER PUBLICATIONS

English translation for JP 2014150104; Jul. 30, 2020 (Year: 2020).*
(Continued)

*Primary Examiner* — Tu B Hoang
*Assistant Examiner* — Thomas J Ward
(74) *Attorney, Agent, or Firm* — Anova Law Group, PLLC (57) ABSTRACT

An electrostatic chuck mechanism and a semiconductor processing device having the same are provided. The electrostatic chuck mechanism includes a base, an edge assembly, a main electrostatic heating layer, and an edge electrostatic heating layer. The base includes a loading surface for loading a wafer and a step surface surrounding the loading surface and located at an edge portion of the wafer. The edge assembly includes a focus ring disposed above the step surface and surrounding the loading surface, and an insulation ring disposed at a bottom of the base and supporting the base. The main electrostatic heating layer, disposed above the loading surface, is configured to secure the wafer and adjust temperature of the wafer. The edge electrostatic
(Continued)

heating layer, disposed above the step surface, is configured to secure the focus ring and adjust temperature of the focus ring.

19 Claims, 3 Drawing Sheets

(51) Int. Cl.
    *H01J 37/32*     (2006.01)
    *H01L 21/48*     (2006.01)
    *H01L 21/687*     (2006.01)
    *H02N 13/00*     (2006.01)

(52) U.S. Cl.
    CPC .. *H01L 21/67103* (2013.01); *H01L 21/67109* (2013.01); *H01L 21/68721* (2013.01); *H02N 13/00* (2013.01)

(58) Field of Classification Search
    USPC ....................................................... 219/444.1
    See application file for complete search history.

(56) References Cited

FOREIGN PATENT DOCUMENTS

| | | | |
|---|---|---|---|
| CN | 103794538 A | 5/2014 | |
| CN | 104752136 A | 7/2015 | |
| CN | 104934345 A | 9/2015 | |
| CN | 105097630 A | 11/2015 | |
| JP | 2008288611 A | 11/2008 | |
| JP | 2011119654 | * 6/2011 | |
| JP | 2011119654 A | 6/2011 | |
| JP | 2013172013 A | 9/2013 | |
| JP | 2014150104 | * 8/2014 | ......... H01L 21/6831 |
| JP | 2014150104 A | 8/2014 | |
| JP | 2015162586 | * 9/2015 | |

OTHER PUBLICATIONS

English translation for JP 2015162586; Jul. 30, 2020 (Year: 2020).*
English translation for JP 2011119654; Jul. 30, 2020 (Year: 2020).*
The World Intellectual Property Organization (WIPO) International Search Report for PCT/CN2016/109237 dated Mar. 22, 2017 6 Pages (including translation).

* cited by examiner

ELECTROSTATIC CHUCK MECHANISM AND SEMICONDUCTOR PROCESSING DEVICE HAVING THE SAME

CROSS-REFERENCE TO RELATED APPLICATIONS

This application is a continuation application of International Application No. PCT/CN2016/109237, filed on Dec. 9, 2016, which claims priority to Chinese Patent Application No. 201510954383.0, filed on Dec. 17, 2015. The above enumerated patent applications are incorporated herein by reference.

TECHNICAL FIELD

The present disclosure relates to the field of semiconductor device fabrication, and more particularly, relates to an electrostatic chuck mechanism and a semiconductor processing device having the same.

BACKGROUND

In a process of fabricating an integrated circuit or a micro-electro-mechanical system (MEMS), in particular, in a process of plasma etching, physical vapor deposition (PVD), chemical vapor deposition (CVD), and etc., an electrostatic chuck is commonly employed for loading and heating a workpiece to be processed, such as a wafer, and the electrostatic chuck also provides a DC bias voltage to the workpiece to be processed, such as a wafer, and controls a surface temperature of the workpiece to be processed.

Figure 1:
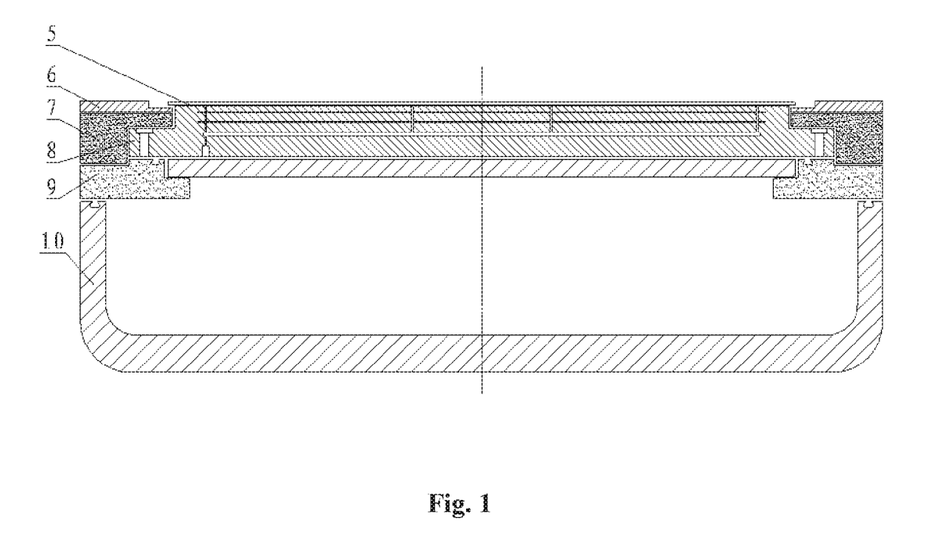
FIG. 1 is a schematic diagram of a structure of a typical electrostatic chuck mechanism.

FIG. 1 is a schematic diagram of a structure of a typical electrostatic chuck mechanism. As shown in FIG. 1, the electrostatic chuck mechanism includes an electrostatic chuck 8 and an edge assembly. The electrostatic chuck 8 is configured to secure a wafer 5 onto an upper surface of the electrostatic chuck 8 by electrostatic adsorption, and a heater is provided in the electrostatic chuck 8 to control a temperature of the wafer 5. The edge assembly includes a focus ring 6, a base ring 7 and an insulation ring 9, which are successively stacked on one another from top to bottom. The insulation ring 9 is fixed on an installing and fixing member 10 and is configured to support the electrostatic chuck 8. The focus ring 6 and the base ring 7 both surround the electrostatic chuck 8, the focus ring 6 is configured to form a boundary within which plasma can be confined; and the base ring 7 is configured to support the focus ring 6 and protect an outer peripheral wall of the electrostatic chuck 8 from being etched by the plasma.

The above-described electrostatic chuck mechanism inevitably suffers from the following problems in practical applications.

After entering the 28-20 nanotechnology generation, high K gate dielectrics and metal gate electrode MOS devices have been introduced to integrated circuit fabrication process, and uniformity ($3\sigma$) of transistor gate lengths among wafers has decreased from 3 nm for 45 nm node to 1.56 nm for 32 nm node, which means a greatly increasing requirement for etching uniformity. However, due to the limitation of the physical dimension of the electrostatic chuck 8, the heater in the electrostatic chuck 8 is unable to control temperature of the wafer 5 around an edge of the wafer 5 (since a diameter of the wafer 5 is slightly greater than an outer diameter of the electrostatic chuck 8, the heater cannot control temperature of a portion on a periphery of the wafer 5 that is not in contact with the electrostatic chuck 8), resulting in non-uniformity of temperature between an edge portion and a center portion of the wafer 5, failing to meet the 28-20 nanotechnology requirement for etching uniformity between the edge portion and the center portion of the wafer 5.

SUMMARY

The present disclosure offers at least one solution to the technical problems in the prior art. An electrostatic chuck mechanism and a semiconductor processing device having the same are provided in the present disclosure. The electrostatic chuck mechanism can separately adjust temperatures of a center portion and an edge portion of the wafer, so that a difference in temperature between the edge portion and the center portion of the wafer can be compensated for, and in turn the process uniformity can be improved.

One aspect of the present disclosure provides an electrostatic chuck mechanism. The electrostatic chuck mechanism may include a base, an edge assembly, a main electrostatic heating layer, and an edge electrostatic heating layer. The base may include a loading surface for loading a wafer and a step surface surrounding the loading surface and located at an edge portion of the wafer. The edge assembly may include a focus ring disposed above the step surface and surrounding the loading surface, and an insulation ring disposed at a bottom of the base and supporting the base. The main electrostatic heating layer, disposed above the loading surface, may be configured to secure the wafer and adjust temperature of the wafer. The edge electrostatic heating layer, disposed above the step surface, may be configured to secure the focus ring and adjust temperature of the focus ring.

Another aspect of the present disclosure further provides a semiconductor processing device having the disclosed electrostatic chuck mechanism according to any of the embodiments. The semiconductor processing device may include a reaction chamber and the electrostatic chuck mechanism provided in the reaction chamber. The electrostatic chuck mechanism may be configured to load a wafer and adjust temperature of the wafer.

The electrostatic chuck mechanism provided by the present disclosure may adjusts a temperature of a wafer by providing a main electrostatic heating layer on the loading surface of the base; and at the same time adjust a temperature of the focus ring and further adjust the temperature at the edge portion of the wafer by providing an edge electrostatic heating layer on the step surface of the base. The electrostatic chuck mechanism can separately adjust the temperatures of the center portion and the edge portion of the wafer, so that a difference in temperature between the edge portion and the center portion of the wafer can be compensated for, and in turn the process uniformity can be improved. Furthermore, the main electrostatic heating layer can also electrostatically adsorb the wafer to secure the wafer. The edge electrostatic heating layer can electrostatically adsorb the focus ring, so that the focus ring can be better secured to the edge electrostatic heating layer, thereby improving the effect of heat transfer to the focus ring.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

In order for a person skilled in the art to better understand technical solutions of the present disclosure, an electrostatic chuck mechanism and a semiconductor processing device according to the present disclosure are described in detail below in conjunction with the accompanying drawings.

Figure 2:
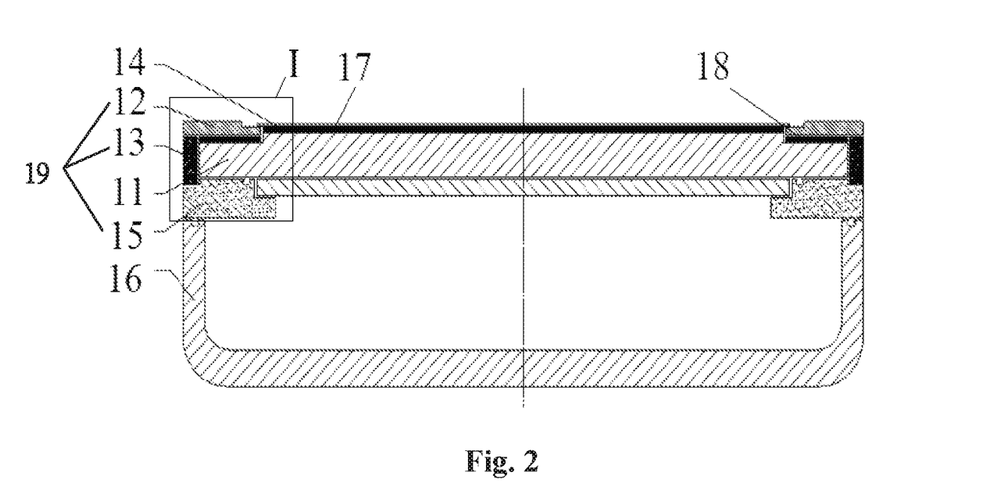
FIG. 2 is a cross-sectional view of an electrostatic chuck mechanism according to some embodiments of the present disclosure.
Figure 3:
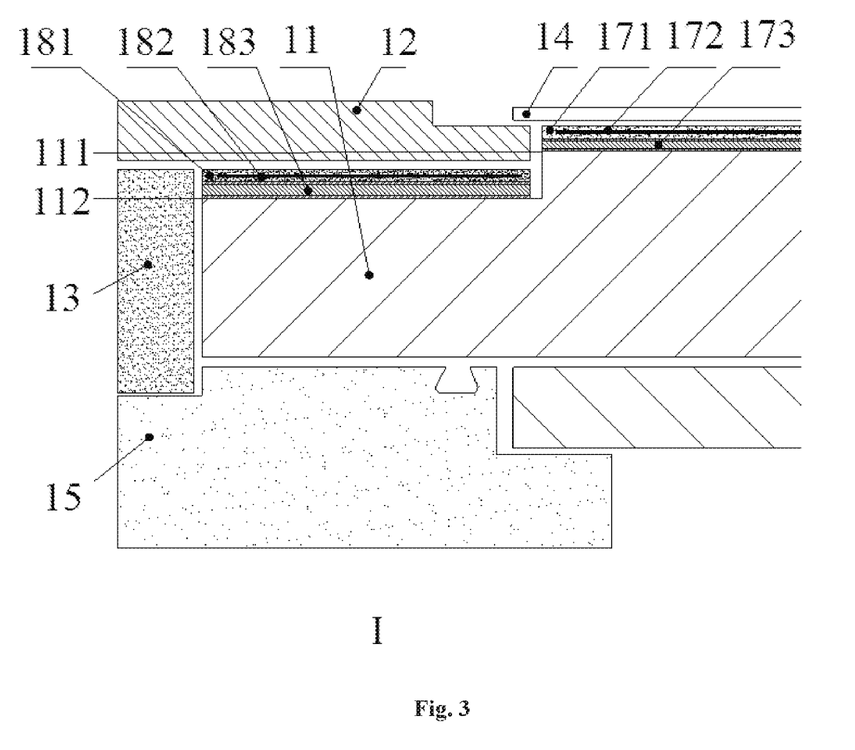
FIG. 3 is an enlarged diagram of an area I in FIG. 2.

FIG. 2 is a cross-sectional view of an electrostatic chuck mechanism according to some embodiments of the present disclosure. FIG. 3 is an enlarged diagram of an area I in FIG. 2. Referring to FIGS. 2 and 3 together, the electrostatic chuck mechanism may include a base 11, an edge assembly 19, a main electrostatic heating layer 17 and an edge electrostatic heating layer 18. The base 11 may include: a loading surface 111 for loading a wafer 14; and a step surface 112 that may surround the loading surface 111 and may be located at the edge portion of the wafer 14, and the step surface 112 may be lower than the loading surface 111. That is, a protrusion may be formed in a center portion of an upper surface of the base 11, an upper surface of the protrusion may serve as the loading surface 111 for loading the wafer 14, and an edge portion of the upper surface of the base 11, that is, the ring-shaped surface surrounding the protrusion, may serve as the step surface 112. Generally, a diameter of the wafer 14 may be slightly larger than a diameter of the loading surface 111, and thus an edge portion of the wafer 14 may extend from the boundary of the loading surface 111 without contacting the loading surface 111.

The edge assembly 19 may include a focus ring 12, a base ring 13 and an insulation ring 15. The focus ring 12 may be disposed above the step surface 112 in a manner of surrounding the loading surface 111, and the edge portion of the wafer 14 extending from the boundary of the loading surface 111 may overlay above an extending end of the focus ring 12, thereby allowing heat transfer between the focus ring 12 and the edge portion of the wafer 14. The base ring 13 may be disposed to surround an outer peripheral wall of the base 11 and positioned between the focus ring 12 and the insulation ring 15 in a vertical direction in view of an orientation of FIG. 2. The base ring 13 may be configured to support the focus ring 12 and protect the outer peripheral wall of the base 11 from being etched by plasma. The insulation ring 15 may be disposed at a bottom of the base 11 and fixed onto a fixing member 16 and configured to support the base 11. The focus ring 12, the base ring 13 and the insulation ring 15 may be prepared using an insulating material selected from at least one of quartz ($SiO_2$), ceramics ($Al_2O_3$), silicon carbide and the like according to requirements of different processes, and the three rings may be made of a same material or different materials.

The main electrostatic heating layer 17 may be disposed above the loading surface 111, configured to attach the wafer 14 onto, such as electrostatically adsorbing the wafer 14, and may adjust a temperature of the wafer 14. In some embodiments, the main electrostatic heating layer 17 may include a main heating layer 173 and a main insulating layer 171 successively disposed from bottom to top in view of an orientation of FIG. 3. In a process, the wafer 14 may be arranged and overlaid above the main insulating layer 171, and the main insulating layer 171 may be provided with a second DC electrode 172 that may be electrically connected to a DC power supply for supplying DC power to the second DC electrode 172, so as to generate an electrostatic adsorbing force to the wafer 14 to secure the wafer 14. The main heating layer 173 may be configured to heat the wafer 14 by heat transfer, that is, to transfer generated heat to the wafer 14 via the main insulating layer 171. The main heating layer 173 may be bonded onto the loading surface 111 by using an adhesive, such as a silica gel.

In some embodiments, the main electrostatic heating layer 17 may be provided with a second channel (not illustrated) for delivering heat exchanging gas towards a position above the main electrostatic heating layer 17. For example, the second channel may be through-holes (not illustrated) correspondingly provided in the main heating layer 173 and the main insulating layer 171 and penetrating through thicknesses of the main heating layer 173 and the main insulating layer 171, respectively, and the through-holes may be arranged to deliver heat exchanging gas (for example, inert gas such as helium) towards a position between a lower surface of the wafer 14 and an upper surface of the main insulating layer 171. The heat exchanging gas can not only accelerate heat transfer between the main insulating layer 171 and the wafer 14, but also increase uniformity of the heat transfer, thereby improving heating efficiency and heating uniformity.

The edge electrostatic heating layer 18 may be disposed above the step surface 112, configured to attach to the focus ring 12, such as electrostatically adsorbing the focus ring 12, and can adjust a temperature of the focus ring 12. In some embodiments, the edge electrostatic heating layer 18 may include an edge heating layer 183 and an edge insulating layer 181 successively disposed from bottom to top in view of the orientation of FIG. 3. The focus ring 12 may be arranged and overlaid above the edge insulating layer 181, and the edge heating layer 183 may be configured to heat the focus ring 12 by heat transfer, that is, to transfer generated heat to the focus ring 12 via the edge insulating layer 181. An edge portion of the wafer 14 extending from the boundary of the loading surface 111 overlays above the focus ring 12, so heat can be transferred between the focus ring 12 and the edge portion of the wafer 14. Thus, the temperature at the edge portion of the wafer 14 may be adjusted indirectly by adjusting the temperature of the focus ring 12. Also, the edge insulating layer 181 is provided with a first DC electrode 182 that is electrically connected to a DC power supply for supplying DC power to the first DC electrode 182, so as to generate an electrostatic adsorbing force to the focus ring 12, so that the focus ring 12 can be better secured to the edge insulating layer 181, thereby improving the effect of heat transfer to the focus ring 12. The edge heating layer 183 may be bonded onto the step surface 113 by using an adhesive, such as a silica gel.

In some embodiments, the edge electrostatic heating layer 18 may be provided with a first channel (not illustrated) for delivering heat exchanging gas towards a position between the focus ring 12 and the edge electrostatic heating layer 18. For example, the first channel may be through-holes (not illustrated) correspondingly provided in the edge heating layer 183 and the edge insulating layer 181 and penetrating through thicknesses of the edge heating layer 183 and the edge insulating layer 181, respectively, and the through-holes may be arranged to deliver heat exchanging gas (for example, inert gas such as helium) towards a position between a lower surface of the focus ring 12 and an upper surface of the edge insulating layer 181. The heat exchanging gas can accelerate heat transfer between the edge insulating layer 181 and the focus ring 12, thereby improving heating efficiency.

With the main electrostatic heating layer 17 and the edge electrostatic heating layer 18, the temperatures of a center portion (the portion in contact with the loading surface 111) and an edge portion (the portion extending from the boundary of the loading surface 111) of the wafer 14 may be separately adjusted, so that a difference in temperature between the edge portion and the center portion of the wafer 14 can be compensated for, and in turn the process uniformity can be improved.

In some embodiments, the electrostatic chuck mechanism may further include a radio frequency (RF) source (not illustrated) configured to supply RF energy to the wafer 14 and the focus ring 12 simultaneously, so as to attract plasma to move towards an upper surface of the wafer 14. Further, since RF energy is supplied to the wafer 14 while being supplied to the focus ring 12, an area of effective electrical field of the wafer 14 can be increased, so that the process uniformity can be improved. The RF source generally may include an adapter and a RF power supply.

In practical applications, different RF sources may be employed to supply RF energy to the wafer 14 and the focus ring 12, respectively. That is, a main RF source configured to supply RF energy to the wafer 14 and an edge RF source configured to supply RF energy to the focus ring 12 may be provided separately. With the main RF source and the edge RF source, a magnitude of the RF energy supplied to the wafer 14 and the focus ring 12 may be separately controlled according to different process requirements, so that plasma distributions in the center portion and the edge portion of the wafer 14 may be separately controlled, and further adjustment window of the plasma may be increased, thereby improving process uniformity.

In some embodiments, the electrostatic chuck mechanism may further include an edge temperature sensor, a center temperature sensor and a temperature control unit, the above of which are not illustrated in the drawings. The edge temperature sensor may be disposed in the base 11 and close to the edge portion of the wafer 14 and configured to detect temperature at the edge portion of the wafer 14 and send a detection result to the temperature control unit. The center temperature sensor may be disposed in the base 11 and close to the center portion of the wafer 14 and configured to detect temperature at the center portion of the wafer 14 and send a detection result to the temperature control unit. The temperature control unit may be configured to control an operating state of the edge electrostatic heating layer 18 according to the temperature at the edge to control the temperature of the focus ring 12, so as to control the temperature at the edge portion of the wafer 14; and configured to control an operating state of the main electrostatic heating layer 17 to control the temperature at the center portion of the wafer 14. With the edge temperature sensor, the center temperature sensor and the temperature control unit, the temperatures at the center portion and the edge portion of the wafer 14 may be precisely controlled, respectively, so that the temperature uniformity of the wafer 14 can be further improved, and in turn the process uniformity can be improved.

It is to be noted that, in some embodiments of the present disclosure, the edge electrostatic heating layer 18 may be formed by the edge heating layer 183 and the edge insulating layer 181, but the present disclosure is not limited thereto. In other embodiments, the edge electrostatic heating layer may be provided to have one edge insulating layer only, the focus ring is overlaid above the edge insulating layer, and a first DC electrode is provided in the edge insulating layer. By supplying DC power to the first DC electrode, electrostatic adsorbing force is generated to secure the focus ring. Further, a first heating element may be provided in the edge insulating layer to heat the focus ring by heat transfer. That is, temperature adjustment of the focus ring may be achieved by embedding the heating element in the edge insulating layer. The edge electrostatic heating layer having the above structure may be manufactured by, for example, sintering.

In some embodiments, the first channel may be a through-hole provided in the edge insulating layer and penetrating through a thickness of the edge insulating layer and configured to deliver heat exchanging gas towards a position between a lower surface of the focus ring and an upper surface of the edge insulating layer, so as to accelerate heat transfer between the edge insulating layer and the focus ring, thereby improving heating efficiency.

It is also to be noted that, in some embodiments of the present disclosure, the main electrostatic heating layer 17 may be formed by the main heating layer 173 and the main insulating layer 171, but the present disclosure is not limited thereto. In other embodiments, the main electrostatic heating layer may be provided to have one main insulating layer only, the wafer may be overlaid above the main insulating layer, and a second DC electrode may be provided in the main insulating layer. By supplying DC power to the second DC electrode, electrostatic adsorbing force may be generated to secure the wafer. Further, a second heating element may be provided in the main insulating layer to heat the wafer by heat transfer. That is, temperature adjustment of the wafer may be achieved by embedding the heating element in the main insulating layer. The main electrostatic heating layer having the above structure may be manufactured by sintering.

In some embodiments, the second channel may be a through-hole provided in the main insulating layer and penetrating through a thickness of the main insulating layer and configured to deliver heat exchanging gas towards a position above the main insulating layer, i.e., towards a position between a lower surface of the wafer and an upper surface of the main insulating layer, so as to accelerate heat transfer between the main insulating layer and the wafer, thereby improving heating efficiency.

A temperature adjustment system of the electrostatic chuck mechanism according to some embodiments of the present disclosure is described in detail below in conjunction with FIG. 4.

Figure 4:
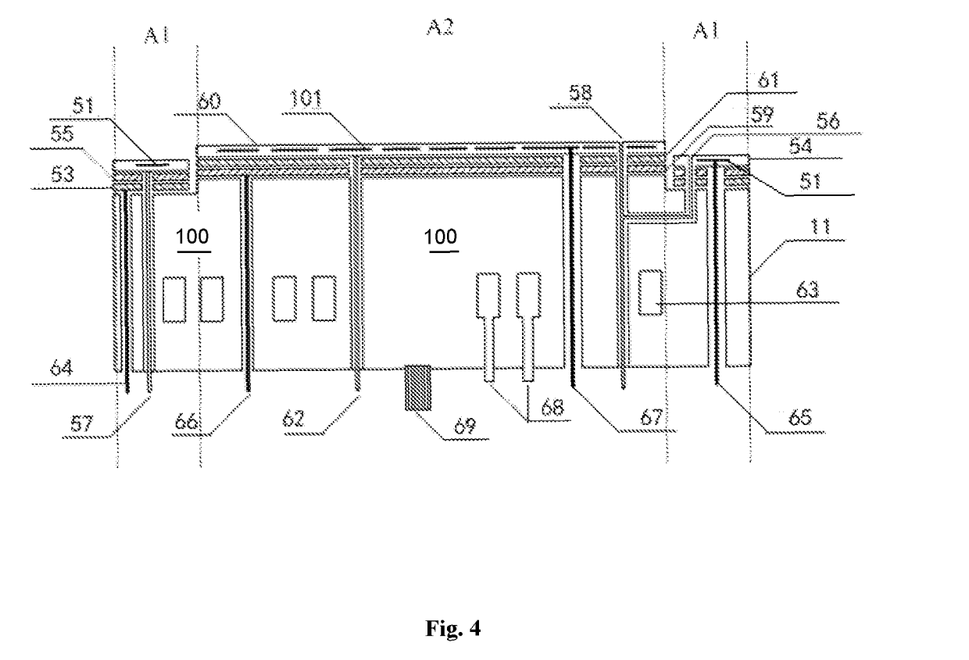
FIG. 4 is a schematic diagram of a partial sectional structure of an electrostatic chuck mechanism according to some embodiments of the present disclosure.

As shown in FIG. 4, the electrostatic chuck mechanism according to some embodiments of the present disclosure may include a base 11 and a focus ring 12 surrounding the base 11. For convenience of description, an area corresponding to the position at which the focus ring 12 is disposed is called 'focus ring area A1', an area corresponding to the position at which the wafer is disposed is called 'wafer area A2', and the focus ring area A1 may surround the wafer area A2.

In some embodiments, in the focus ring area A1, the electrostatic chuck mechanism may further include a first heating layer 53, a first heating element (not illustrated), and a first heating connection element 64. The first heating layer 53 may be disposed to surround the base 11 and located below the focus ring 12; the first heating element may be disposed in the first heating layer 53 and configured to heat the focus ring 12 by converting electrical energy into thermal energy. The first heating connection element 64 may penetrate through the base 11 and may be connected to the first heating layer 53. The first heating connection element 64 may be configured to input a first electrical heating signal to the first heating layer 53, and, in response to the first electrical heating signal, the first heating layer 53 may convert the first electrical heating signal into thermal energy.

The electrostatic chuck mechanism may further include a first electrostatic layer 54, a first DC electrode 51 and a first DC electrode connection element 65. The first electrostatic layer 54 may be disposed to surround the base 11 and located between the focus ring 12 and the first heating layer 53. The first DC electrode 51 may be disposed in the first electrostatic layer 54. The first DC electrode connection element 65 may penetrate through the base 11 and the first heating layer 53 and may be connected to the first DC electrode 51 in the first electrostatic layer 54. The first DC electrode connection element 65 may be configured to input a first DC voltage to the first DC electrode 51, and the first DC electrode 51 can form an electrical field under the control of the first DC voltage, to enable the first electrostatic layer 54 to adsorb the focus ring 12 thereon by electrostatic adsorption, thereby securing the focus ring 12.

The electrostatic chuck mechanism may further include a first uniform heat plate 55. The first uniform heat plate 55 may be made of a thermal-conductive material having a good thermal conduction ability and may be disposed to surround the base 11 and be in contact with an upper surface of the first heating layer 53. That is, the first uniform heat plate 55 may be located between the first heating layer 53 and the first electrostatic layer 54. Because different positions of the focus ring 12 have different temperatures, with the first uniform heat plate 55 having good thermal conduction ability, the temperatures of the different positions of the focus ring 12 can be continuously transitioned and tend to be uniform.

The electrostatic chuck mechanism may further include a first gas channel 56. The first gas channel 56 may penetrate through the first heating layer 53, the first uniform heat plate 55 and the first electrostatic layer 54 and may be configured to deliver heat exchanging gas to a lower surface (i.e. back surface) of the focus ring 12, so as to form a gas layer at the lower surface of the focus ring 12. The temperature of the focus ring 12 may keep consistent with the temperature of the base 11 due to good thermal conductivity of the heat exchanging gas. That is, the temperature of the focus ring 12 may be effectively controlled by increasing heat exchanging ability between the focus ring 12 and the first electrostatic layer 54. Preferably, the heat exchanging gas may be helium, but the type of the heat exchanging gas is not limited thereto. The heat exchanging gas may be other gas, as long as heat exchange between the focus ring 12 and the first electrostatic layer 54 can be achieved, which is not described in further detail.

The electrostatic chuck mechanism may further include a first temperature control unit (not illustrated). The first temperature control unit may include a first detection module 57 and a first control module (not illustrated). The first detection module 57 may be configured to detect current temperature of the focus ring 12 and send the detected temperature to the first control module. The first control module may be configured to control temperature of the focus ring 12 according to the current temperature of the focus ring 12. For examples, the first detection module 57 may penetrate through the base 11, the first heating layer 53 and the first uniform heat plate 55 from the bottom of the base 11 and may be in contact with the first electrostatic layer 54, to detect the current temperature of the focus ring 12. The temperature of the focus ring 12 may be controlled by the first control module. In some embodiments, the first detection module 57 may be a thermocouple, but the first detection module 57 may be not limited thereto, other temperature detecting element may be applied, which is not described in further detail.

In some embodiments, in the wafer area A2, the electrostatic chuck mechanism may further include a second heating layer 59, a second heating element (not illustrated), and a second heating connection element 66. The second heating layer 59 may be disposed above the central protruding part of the base 11. The second heating element may be disposed in the second heating layer 59 and configured to heat the wafer placed above the base 11 by converting electrical energy into thermal energy. The second heating connection element 66 may penetrate through the base 11 and may be connected to the second heating layer 59 and configured to input a second electrical heating signal to the second heating layer 59, and, in response to the second electrical hearing signal, the second heating layer 59 may convert the second electrical heating signal into thermal energy to heat the wafer located above the second heating layer 59.

The electrostatic chuck mechanism may further include a second electrostatic layer 60. The second electrostatic layer 60 may be arranged above the second heating layer 59 and provided with a second DC electrode 101. The second DC electrode 101 can form an electrical field under a control of a voltage, to enable the second electrostatic layer 60 to adsorb the wafer on the second electrostatic layer 60 by electrostatic adsorption.

The electrostatic chuck mechanism may further include a second DC electrode connection element 67. The second DC electrode connection element 67 may penetrate through the base 11 and the second heating layer 59 and may be connected to the second DC electrode 101 in the second electrostatic layer 60. The second DC electrode connection element 67 may input a second DC voltage to the second DC electrode 101, and, in response to the second DC voltage, the second DC electrode 101 may form an electrical field under the control of the second DC voltage to adsorb the wafer.

The electrostatic chuck mechanism may further include a second uniform heat plate 61. The second uniform heat plate 61 may be in contact with an upper surface of the second heating layer 59. That is, the second uniform heat plate 61 may be located between the second heating layer 59 and the second electrostatic layer 60. Because different positions of the wafer have different temperatures, with the second uniform heat plate 61 having good thermal conduction ability, the temperatures at the different positions of the wafer can be continuously transitioned and tend to be uniform.

The electrostatic chuck mechanism may further include a second temperature control unit (not illustrated). The second temperature control unit may include a second detection module 62 and a second control module (not illustrated). The second detection module 62 may be configured to detect current temperature of the wafer and send the detected temperature to the second control module. The second control module may be configured to control temperature of the wafer according to the current temperature of the wafer. For examples, the second detection module 62 may penetrate through the base 11, the second heating layer 59 and the second uniform heat plate 61 from the bottom of the base 11 and may be in contact with the second electrostatic layer 60, to detect the current temperature of the wafer, and the temperature of the wafer may be controlled by the second control module. In some embodiments, the second detection module 62 may be a thermocouple, but the second detection module 62 is not limited thereto, other temperature detecting element may be applied, which is not described in further detail.

The electrostatic chuck mechanism may further include a second gas channel 58. The second gas channel 58 may penetrate through the base 11 from the bottom of the base 11, to deliver heat exchanging gas to a lower surface (i.e. back surface) of the wafer, so as to form a gas layer at the lower surface of the wafer. The temperature of the wafer may keep consistent with the temperature of the electrostatic chuck mechanism due to good thermal conductivity of the heat exchanging gas. That is, the temperature of the wafer may be effectively controlled by increasing heat exchanging ability between the wafer and the second electrostatic layer 60. In some embodiments, the heat exchanging gas may be helium, but the type of the heat exchanging gas is not limited thereto. The heat exchanging gas may be other gas.

In some embodiments, the first gas channel 56 and the second gas channel 58 may communicate with each other. That is, the first gas channel 56 and the second gas channel 58 may have a same gas inlet. The first gas channel 56 may be configured to introduce heat exchanging gas from the gas inlet to the lower surface of the focus ring 12 to control the temperature of the focus ring 12. The second gas channel 58 may be configured to introduce the heat exchanging gas from the gas inlet to the lower surface of the wafer to control the temperature of the wafer. The first gas channel 56 and the second gas channel 58 can be simplified in structure by making the first gas channel 56 and the second gas channel 58 communicate with each other.

The electrostatic chuck mechanism may further include a heat medium flow channel 63. The heat medium flow channel 63 may be disposed in the base 11 and distributed in both the focus ring area A1 and the wafer area A2. Heat medium fluid for maintaining basal temperature of the base 11 may be supplied into the heat medium flow channel 63. The heat medium flow channel 63 may be connected to a heat medium entrance 68 that is configured to introduce heat medium fluid in or out of the heat medium flow channel 63.

The electrostatic chuck mechanism may further include a RF electrode input terminal 69. The RF electrode input terminal 69 may be connected to the base 11, and in a process, the RF electrode input terminal 69 can introduce RF energy into the electrostatic chuck mechanism.

In the electrostatic chuck mechanism according to some embodiments of the present disclosure, a focus ring 12 may be disposed to surround the base 11, and a first heating layer 53 may be disposed to surround the base 11 and below the focus ring 12. A first heating element may be disposed in the first heating layer 53, and the first heating element may be connected to an external power supply via a first heating connection element 64 penetrating through the base 11, so as to heat the focus ring 12 by generating thermal energy from electrical energy. By separately heating the focus ring 12, the temperature of the focus ring 12 may be controlled more precisely, thereby reducing temperature difference between the edge portion and the center portion of the wafer.

Another aspect of the present disclosure further provides a semiconductor processing device according to some embodiments of the present disclosure. The semiconductor processing device may include a reaction chamber 100 and an electrostatic chuck mechanism provided in the reaction chamber 100. The electrostatic chuck mechanism may be configured to load a wafer and adjust temperature of the wafer. The electrostatic chuck mechanism may employ the electrostatic chuck mechanism according to the embodiments of the present disclosure.

The semiconductor processing device provided by the embodiment of the present disclosure can separately adjust the temperatures of a center portion and an edge portion of the wafer by employing the electrostatic chuck mechanism according to the embodiments of the present disclosure, so that a difference in temperature between the edge portion and the center portion of the wafer can be compensated for, and in turn the process uniformity can be improved.

It could be understood that the foregoing implementations are exemplary implementations merely used for illustrating the principle of the present disclosure, but the present disclosure is not limited thereto. A person of ordinary skill in the art may make various variations and modifications without departing from the spirit and essence of the present disclosure, and these variations and modifications are also considered to fall within the protection scope of the present disclosure.

What is claimed is:

1. An electrostatic chuck mechanism, comprising a base, an edge assembly, a main electrostatic heating layer, and an edge electrostatic heating layer, wherein:
   the base comprises a loading surface for loading a wafer, and a step surface surrounding the loading surface,
   the edge assembly comprises a focus ring disposed above the step surface and surrounding the loading surface, a base ring and an insulation ring disposed at a bottom of the base and supporting the base,
   the main electrostatic heating layer, disposed above the loading surface, is configured to secure the wafer and adjust temperature of the wafer,
   the edge electrostatic heating layer, disposed on the step surface, is configured to secure the focus ring and adjust temperature of the focus ring, wherein an edge portion of the wafer extends from the a boundary of the loading surface and overlays inner edges of the step surface, the edge electrostatic heating layer and the focus ring respectively, and
   the base ring is disposed between the focus ring and the insulation ring and surrounding an outer peripheral wall of the base, and covering an outer edge of the heating layer.

2. The electrostatic chuck mechanism according to claim 1, wherein the edge electrostatic heating layer comprises an edge heating layer and an edge insulating layer on the edge heating layer, wherein:
   the focus ring is arranged above the edge insulating layer, the edge insulating layer is provided with a first DC electrode, and electrostatic adsorbing force is generated to secure the focus ring by supplying DC power to the first DC electrode, and
   the edge heating layer is configured to heat the focus ring by heat transfer.

3. The electrostatic chuck mechanism according to claim 1, wherein the main electrostatic heating layer comprises a main heating layer and a main insulating layer on the main heating layer, wherein:
   the wafer is arranged above the main insulating layer, the main insulating layer is provided with a second DC electrode, and electrostatic adsorbing force is generated to secure the wafer by supplying DC power to the second DC electrode, and
   the main heating layer is configured to heat the wafer by heat transfer.

4. The electrostatic chuck mechanism according to claim 1, wherein the edge electrostatic heating layer comprises an edge insulating layer, wherein:
the focus ring is arranged above the edge insulating layer, the edge insulating layer is provided with a first DC electrode, and electrostatic adsorbing force is generated to secure the focus ring by supplying DC power to the first DC electrode, and
the edge insulating layer is further provided with a first heating element configured to heat the focus ring by heat transfer.

5. The electrostatic chuck mechanism according to claim 1, wherein the main electrostatic heating layer comprises a main insulating layer, wherein:
the wafer is arranged above the main insulating layer, the main insulating layer is provided with a second DC electrode, and electrostatic adsorbing force is generated to secure the wafer by supplying DC power to the second DC electrode, and
the main insulating layer is further provided with a second heating element configured to heat the wafer by heat transfer.

6. The electrostatic chuck mechanism according to claim 1, wherein the edge electrostatic heating layer is provided with a first channel configured to deliver heat exchanging gas towards a position between the focus ring and the edge electrostatic heating layer.

7. The electrostatic chuck mechanism according to claim 1, wherein the main electrostatic heating layer is provided with a second channel configured to deliver heat exchanging gas towards a position above the main electrostatic heating layer.

8. The electrostatic chuck mechanism according to claim 1, wherein the electrostatic chuck mechanism further comprises a RF source configured to supply RF energy to the wafer and the focus ring simultaneously.

9. The electrostatic chuck mechanism according to claim 1, wherein the electrostatic chuck mechanism further comprises a main RF source and an edge RF source, wherein:
the main RF source is configured to supply RF energy to the wafer, and
the edge RF source is configured to supply RF energy to the focus ring.

10. The electrostatic chuck mechanism according to claim 1, wherein the electrostatic chuck mechanism further comprises an edge temperature sensor, a center temperature sensor and a temperature controller, wherein:
the edge temperature sensor is disposed in the base and close to the edge portion of the wafer, and is configured to detect temperature at the edge portion of the wafer and send a detected temperature to the temperature controller,
the center temperature sensor is disposed in the base and close to a center portion of the wafer, and is configured to detect temperature at the center portion of the wafer and send a detected temperature to the temperature controller, and
the temperature controller is configured to control an operating state of the edge electrostatic heating layer according to the temperature at the edge portion to control the temperature of the focus ring, so as to control the temperature at the edge portion of the wafer; and configured to control an operating state of the main electrostatic heating layer according to the temperature at the center portion to control the temperature at the center portion of the wafer.

11. The electrostatic chuck mechanism according to claim 1, wherein the step surface is lower than the loading surface, a protrusion is formed in a center portion of the base, and a surface of the protrusion is arranged for loading the wafer as the loading surface.

12. The electrostatic chuck mechanism according to claim 1, wherein the focus ring includes an extending end below the outer edge portion of the wafer.

13. The electrostatic chuck mechanism according to claim 1, wherein the focus ring is made of quartz, ceramics, silicon carbide, or any combination thereof.

14. The electrostatic chuck mechanism according to claim 3, wherein the main heating layer is bonded onto the loading surface by a silica gel.

15. A semiconductor processing device, comprising a reaction chamber and an electrostatic chuck mechanism provided in the reaction chamber, the electrostatic chuck mechanism configured to load a wafer and adjust temperature of the wafer, wherein the electrostatic chuck mechanism comprising
a base, an edge assembly, a main electrostatic heating layer, a base ring and an edge electrostatic heating layer, wherein:
the base comprises a loading surface for loading a wafer, and a step surface surrounding the loading surface,
the edge assembly comprises a focus ring disposed above the step surface and surrounding the loading surface, and an insulation ring disposed at a bottom of the base and supporting the base,
the main electrostatic heating layer, disposed above the loading surface, is configured to secure the wafer and adjust temperature of the wafer,
the edge electrostatic heating layer, disposed above the step surface, is configured to secure the focus ring, wherein an edge portion of the wafer extends from the a boundary of the loading surface and overlays inner edges of the step surface, the edge electrostatic heating layer and the focus ring respectively,
and the base ring is between the focus ring and the insulation ring and surrounding an outer peripheral wall of the base, and covering an outer edge of the heating layer.

16. The semiconductor processing device according to claim 15, further including a first heating connection element penetrating through the base and connected to the edge electrostatic heating layer, wherein the first heating connection element is configured to send a first electrical signal to the edge electrostatic heating layer, and the edge electrostatic heating layer converts the first electrical signal into thermal energy to adjust the temperature of the focus ring.

17. The semiconductor processing device according to claim 15, further including a second heating connection element penetrating through the base and connected to the main electrostatic heating layer, wherein the second heating connection element is configured to send a second electrical signal to the main electrostatic heating layer, and the main electrostatic heating layer converts the second electrical signal into thermal energy to adjust the temperature of the wafer.

18. The semiconductor processing device according to claim 15, further including a first uniform plate located in the edge electrostatic heating layer and made of a thermal-conductive material.

19. The semiconductor processing device according to claim 15, further including a second uniform plate located in the main electrostatic heating layer and made of a thermal-conductive material.

* * * * *